United States Patent
Yoo et al.

(10) Patent No.: US 9,209,101 B2
(45) Date of Patent: Dec. 8, 2015

(54) SEMICONDUCTOR PACKAGE WITH A CONDUCTIVE SHIELDING MEMBER

(75) Inventors: Do-Jae Yoo, Suwon-si (KR); Young-Do Kweon, Seoul (KR); Joon-Seok Kang, Suwon-si (KR); Chang-Bae Lee, Yongin-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 316 days.

(21) Appl. No.: 12/892,032

(22) Filed: Sep. 28, 2010

(65) Prior Publication Data

US 2011/0298102 A1 Dec. 8, 2011

(30) Foreign Application Priority Data

Jun. 3, 2010 (KR) ........................ 10-2010-0052401

(51) Int. Cl.
*H01L 23/552* (2006.01)
*H01L 23/31* (2006.01)
*H01L 23/498* (2006.01)
*H01L 23/50* (2006.01)
*H01L 23/00* (2006.01)

(52) U.S. Cl.
CPC ...... *H01L 23/3121* (2013.01); *H01L 23/49811* (2013.01); *H01L 23/50* (2013.01); *H01L 23/552* (2013.01); *H01L 24/73* (2013.01); *H01L 24/48* (2013.01); *H01L 2224/16225* (2013.01); *H01L 2224/48091* (2013.01); *H01L 2224/48227* (2013.01); *H01L 2224/73257* (2013.01); *H01L 2924/3025* (2013.01)

(58) Field of Classification Search
CPC ..................................................... H01L 23/552
USPC ......................................... 257/659, E23.114
See application file for complete search history.

(56) References Cited

U.S. PATENT DOCUMENTS

2008/0185699 A1* 8/2008 Wang ............................ 257/676
2010/0027225 A1* 2/2010 Yuda et al. .................... 361/736

FOREIGN PATENT DOCUMENTS

WO    WO 2008/136251    * 11/2008

* cited by examiner

*Primary Examiner* — Hsin-Yi Hsieh
(74) *Attorney, Agent, or Firm* — NSIP Law

(57) ABSTRACT

A semiconductor package and a method of manufacturing the semiconductor package are disclosed. A semiconductor package in accordance with an embodiment of the present invention includes a substrate, which is formed with a ground circuit and mounted with a semiconductor chip on one surface, a conductive ground layer, which is formed on the other surface of the substrate and connected with the ground circuit, a molding, which seals up the ground layer and the substrate having the semiconductor chip mounted thereon, and a conductive shield, which covers the molding and is connected with the ground layer. With a semiconductor package in accordance with an embodiment of the present invention, grounding for shielding is possible even in an entirely molded structure, and a double shielding structure to improve the shielding property.

6 Claims, 3 Drawing Sheets

FIG. 1

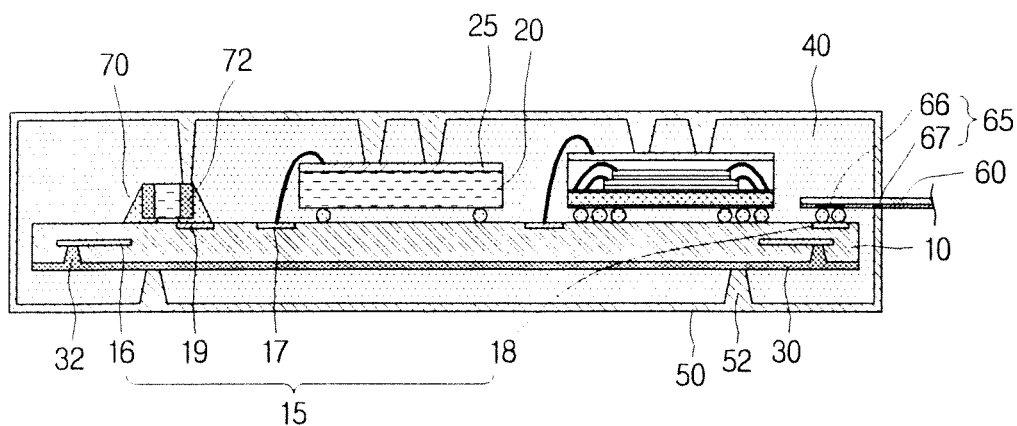

FIG. 2

| Form a substrate having a ground circuit formed thereon and a semiconductor chip mounted on one surface thereof | S110 |
| Form a conductive ground layer, connected with the ground circuit, on the other surface of the substrate | S120 |
| Form a molding to seal up the substrate, having the semiconductor chip mounted thereon, and the ground layer | S130 |
| Form a conductive shield covering the molding and connected with the ground layer | S140 |

SEMICONDUCTOR PACKAGE WITH A CONDUCTIVE SHIELDING MEMBER

CROSS-REFERENCE TO RELATED APPLICATIONS

This application claims the benefit of Korean Patent Application No. 10-2010-0052401, filed with the Korean Intellectual Property Office on Jun. 3, 2010, the disclosure of which is incorporated herein by reference in its entirety.

BACKGROUND

1. Technical Field

The present invention is related to a semiconductor package and a method of manufacturing the semiconductor package.

2. Description of the Related Art

It is common that electromagnetic waves are generated from a semiconductor chip mounted in a semiconductor package. The electromagnetic waves not only disturb other semiconductor chips or lower the efficiency of signal transfer but also are harmful to the human body. Developed accordingly is a shielding technology that covers the semiconductor package with a conductive shielding member.

With the increasingly smaller and thinner electronic devices, the semiconductor packages used in the electronic devices are becoming increasingly smaller and thinner. Accordingly, in order to protect and better handle the smaller semiconductor package, methods of molding the entire semiconductor package have been studied.

When the entire semiconductor package is to be molded, a grounding technology for shielding needs to be also considered, but there has been no grounding technology developed for the entirely molded semiconductor package. In other words, the shielding member and a ground circuit need to be connected to each other in order to shield the electromagnetic waves, but it has been difficult to provide a connection path between the shielding member and the ground circuit in the entirely molded semiconductor package.

Furthermore, although the conventional shielding technology was able to block the electromagnetic waves emitted to the outside of the semiconductor package or the electromagnetic waves permeated into the semiconductor package from the outside, it has not been able to block the electromagnetic waves between the semiconductor chips within the semiconductor package.

SUMMARY

The present invention provides a semiconductor package and a method of manufacturing the semiconductor package that can be grounded for shielding in an entirely molded structure.

The present invention also provides a semiconductor package and a method of manufacturing the semiconductor package that can block electromagnetic waves between semiconductor chips mounted inside the semiconductor package.

An aspect of the present invention features a semiconductor package. The semiconductor package in accordance with an embodiment of the present invention includes a substrate, which is formed with a ground circuit and mounted with a semiconductor chip on one surface, a conductive ground layer, which is formed on the other surface of the substrate and connected with the ground circuit, a molding, which seals up the ground layer and the substrate having the semiconductor chip mounted thereon, and a conductive shield, which covers the molding and is connected with the ground layer.

The semiconductor package can also include a connector, which has a ground pattern connected with the shield and the ground circuit of the substrate and is connected to the outside of the shield.

The semiconductor package can also include a semiconductor shielding layer, which is formed on an upper surface of the semiconductor chip and connected with the ground circuit.

The semiconductor shielding layer can be connected with the shield.

The semiconductor package can also include a conductive post, which connects the shield and the semiconductor shielding layer with each other.

The semiconductor shielding layer and the ground circuit can be connected by way of wire-bonding.

The semiconductor package can also include an electronic device, which has a ground electrode connected with the ground circuit, and the ground electrode can be connected with the shield.

Another aspect of the present invention features a method of manufacturing a semiconductor package. The method of manufacturing a semiconductor package in accordance with an embodiment of the present invention can include: providing a substrate, the substrate having a ground circuit formed thereon, a semiconductor chip being mounted on one surface of the substrate; forming a ground layer on the other surface of the substrate, the ground layer being conductive and connected with the ground circuit; forming a molding in such a way that the ground layer and the substrate having the semiconductor chip mounted thereon are sealed up; and forming a shield, the shield covering the mold, the shield being conductive and connected with the ground layer.

The forming of a ground layer can include: forming a via hole on the other surface of the substrate, the via hole exposing the ground circuit; and forming a conductive ground layer connected with the ground circuit by coating a conductive material on the other surface of the substrate.

The forming of a shield can include: forming a through-hole in the molding, the semiconductor shielding layer being exposed through the through-hole; and forming a conductive shield connected with the ground layer by coating a conductive material on the molding.

The method of manufacturing a semiconductor package can also include forming a conductive post on the ground layer, and the forming of a shield can include forming a shield connected with the conductive post.

The method of manufacturing a semiconductor package can also include: forming a semiconductor shielding layer on an upper surface of the semiconductor chip; and connecting the semiconductor shielding layer and the ground circuit with each other.

The forming of a shield can form a shield connected with the semiconductor shielding layer.

The connecting of the ground circuit can include connecting the semiconductor shielding layer and the ground circuit with each other by way of wire-bonding.

The method of manufacturing a semiconductor package can also include coupling a connector to the substrate such that a ground pattern of the connector is connected with the ground circuit, and the forming of the shield can form a shield connected with the ground pattern.

BRIEF DESCRIPTION OF THE DRAWINGS

FIG. 1 is a sectional view of a semiconductor package in accordance with an embodiment of the present invention.

FIG. 2 is a flow diagram of a method of manufacturing a semiconductor package in accordance with another embodiment of the present invention.

DETAILED DESCRIPTION

Figure 3:
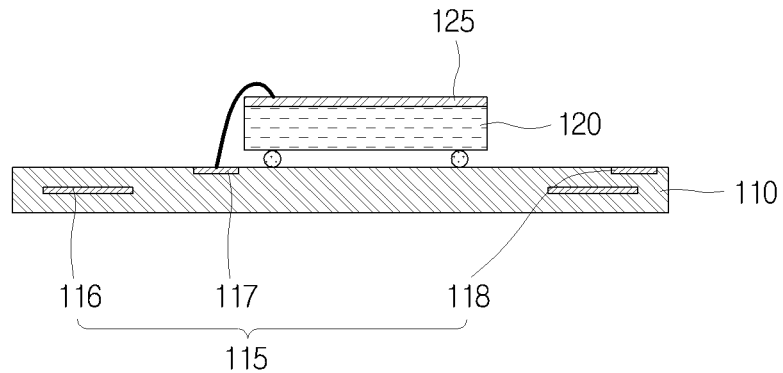
FIG. 3 to FIG. 8 are sectional views illustrating the method of manufacturing a semiconductor package in accordance with another embodiment of the present invention.

Hereinafter, some embodiments of the present invention will be described with reference to the accompanying drawings.

FIG. 1 is a sectional view of a semiconductor package in accordance with an embodiment of the present invention.

The semiconductor package in accordance with an embodiment of the present invention includes a substrate 10, a ground layer 30, a molding 40 and a shield 50.

The substrate 10 is where a semiconductor chip 20 is mounted, and is formed with a circuit pattern, which is connected to the semiconductor chip 20, and a ground circuit 15, which is needed for shielding. The semiconductor chip 20 is an electronic part in which a variety of devices are integrated to perform certain functions.

In the present embodiment, the semiconductor chip 20 is mounted on one surface of the substrate 10, and the ground circuit 15 includes ground pads 16, 17, 18, 19 required for grounding.

The ground layer 30 is a part that forms a path for grounding the shield, which will be described later, and also functions to block electromagnetic waves generated from the semiconductor chip 20 and emitted to the other surface of the substrate 10. For this, the ground layer 30 is made of a conductive material, such as metal, and is formed on the other surface of the substrate 10 and connected to the ground circuit 15. Accordingly, grounding can be made by connecting the shield 50 to the other surface of the substrate 10 only. That is, the shield 50 can be readily grounded in an entirely molded semiconductor package as well.

Moreover, the ground layer 30 can form a double shielding structure together with the shield 50 to improve the shielding property.

Specifically, the ground layer 30 of the present embodiment can be a form in which a conductive material is coated and hardened on the other surface of the substrate 10 or a conductive film is adhered to the other surface of the substrate 10. Moreover, the ground layer 30 can be connected to the ground circuit 15 of the substrate 10 through a via 32 formed on the other surface of the substrate 10.

The molding 40 is a part that seals up the substrate 10, on which the semiconductor chip 20 is mounted, and the ground layer 30.

Specifically, the molding 40 that covers and protects the substrate 10 and the semiconductor chip 20 can be formed by immersing the substrate 10, one surface of which is mounted with the semiconductor chip 20 and the other surface of which is formed with the ground layer 30, in a molding resin or by putting the substrate 10 in a molding frame and filling in a molding resin to seal up the substrate 10.

Here, the present embodiment can also include a connector 60 that connects the entirely-molded substrate 10 with another part. The connector 60 is connected with a circuit pattern of the substrate 10 and can be extended to the outside of the molding 40 and the shield 50. Moreover, the connector 60 can be in the form of a terminal that is formed outside the semiconductor package, and one end portion of the terminal can be extended to the inside of the molding 40 and connected to the substrate 10.

The shield 50 is a part that blocks electromagnetic waves from entering and exiting between an external part and the semiconductor package. For this, the shield 50 is made of a conductive material, such as metal, and covers the molding 40. Moreover, the shield 50 is also connected with the ground layer 30 that is connected with the ground circuit 15.

Particularly, the shield 50 of the present embodiment is grounded through the ground layer 30 that is widely formed on the other surface of the substrate 10 so that it is easier to provide the space for grounding.

Specifically, the shield 50 of the present embodiment can be formed by coating a conductive material on the molding 40. In addition, the shield 50 can be connected to the ground layer 30 by being connected to a conductive post 52 that is connected to the ground layer 30.

Here, for uniform grounding of the shield 50, the connector 60 can be furnished with a grounding pattern 65 that is connected with the ground circuit 15 of the substrate 10 and with the shield 50. In the present embodiment, the grounding pattern 65 is formed with a pair of pads 66, 67 that are coupled with the ground circuit 15 and the shield 50, respectively.

For improved shielding property and uniform grounding, the semiconductor package of the present embodiment can also have a semiconductor shielding layer 25, which is formed on an upper surface of the semiconductor chip 20 and connected with the ground circuit 15.

The semiconductor shielding layer 25 blocks electromagnetic waves generated from the semiconductor chip 20. The semiconductor shielding layer 25 can also ground the shield 50. For this, the semiconductor shielding layer 25 is made of a conductive material, such as metal, and is formed on the upper surface of the semiconductor chip 20 and connected with the ground circuit 15. Accordingly, since the electromagnetic waves generated from the semiconductor chip 20 is primarily blocked by the semiconductor shielding layer 25, it is possible to block the electromagnetic waves from being transferred to an adjacent semiconductor chip. In other words, it is possible to shield between semiconductor chips within the semiconductor package.

Moreover, since the shield 50 can be connected to the semiconductor shielding layer 25, the semiconductor shielding layer 25 can ground the shield 50, and the semiconductor shielding layer 25 can form a double shielding structure together with the shield 50, thereby improving the shielding property.

Moreover, since a wide ground area is formed by the semiconductor shielding layer 25 on one face of the semiconductor chip 20, a stable ground can be provided to the semiconductor chip 20.

Specifically, the semiconductor shielding layer 25 of the present embodiment can be a paste form that is stacked and hardened on the upper surface of the semiconductor chip 20 or a conductive film form that is adhered to the upper surface of the semiconductor chip 20. The semiconductor shielding layer 25 can be connected to the ground pad 17 of the ground circuit 15 by wire-bonding. Here, the connection between the semiconductor shielding layer 25 and the ground circuit 15 is not restricted to wire-bonding and can be made by various known connection methods.

The semiconductor shielding layer 25 can be formed on the upper surface of the semiconductor chip 20 as an integrated part of the semiconductor chip 20. Here, the connection between the semiconductor shielding layer 25 and the ground pad can be made through an internal circuit of the semiconductor chip 20.

For more uniform grounding with the shield 50, the shield 50 can be connected with a ground electrode 72 of an electronic device 70. That is, if there is an electronic device 70, which has a ground electrode 72 connected with the ground circuit 15, on the substrate 10, the shield 50 can be also connected with the ground electrode 72 of the electronic device 70.

Hereinafter, a method of manufacturing a semiconductor package in accordance with another embodiment of the present invention will be described.

FIG. 2 is a flow diagram of the method of manufacturing a semiconductor package in accordance with another embodiment of the present invention, and FIG. 3 to FIG. 8 are sectional views illustrating the method of manufacturing a semiconductor package in accordance with another embodiment of the present invention.

The method of manufacturing a semiconductor package in accordance with the present embodiment includes providing a substrate (S110), forming a ground layer (S120), forming a molding (S130) and forming a shield (S140).

In the step of providing a substrate (S110), a substrate 110, on which a ground circuit 115 is formed and a semiconductor chip 120 is mounted, is provided.

The substrate 110, which is a part on which the semiconductor chip 120 is mounted, is formed with a circuit pattern connected to the semiconductor chip 120 and the ground circuit 115 required for shielding. The semiconductor chip 120 is a part in which a variety of devices are integrated to perform certain functions, and is mounted on one face of the substrate 110 in the semiconductor package of this embodiment.

As shown in FIG. 3, in the present embodiment, the semiconductor chip 120 is mounted on one surface of the substrate 110, and the ground circuit 115 includes ground pads 116, 117, 118 needed for grounding.

In the present embodiment, a semiconductor shielding layer 125 can be formed on an upper surface of the semiconductor chip 120 for improved shielding property and uniform grounding. The semiconductor shielding layer 125 is made of a conductive material, such as metal, and is formed on the upper surface of the semiconductor chip 120 and connected with the ground circuit 115. Accordingly, since the electromagnetic waves generated from the semiconductor chip 120 is primarily blocked by the semiconductor shielding layer 125, it is possible to block the electromagnetic waves from being transferred to an adjacent semiconductor chip. In other words, it is possible to shield between semiconductor chips within the semiconductor package.

As shown in FIG. 3, the semiconductor shielding layer 125 of the present embodiment can be stacked and hardened in a paste form on the upper surface of the semiconductor chip 120. Moreover, the semiconductor shielding layer 125 can be adhered to the upper surface of the semiconductor chip as a conductive film form.

Here, in the present embodiment, the semiconductor shielding layer 125 can be connected to the ground pad 117 of the ground circuit 115 by wire-bonding. However, the connection between the semiconductor shielding layer 125 and the ground circuit 115 is not restricted to wire-bonding and can be made by various known connection methods.

Figure 4:
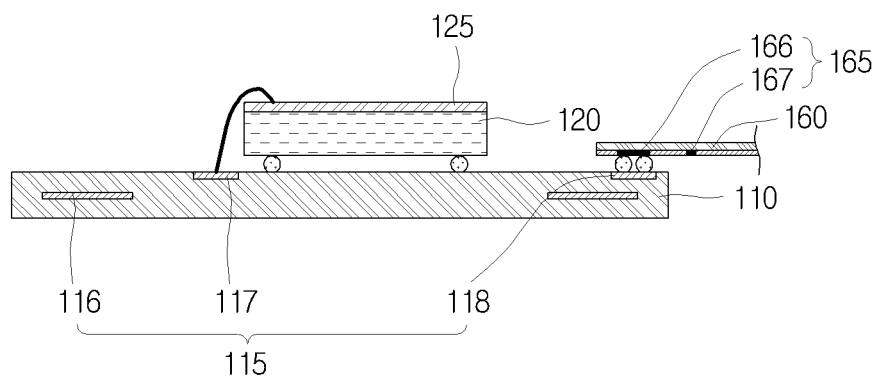

Moreover, in the present embodiment, a connector 160, which connects the substrate 110 with another part, can be additionally connected to the substrate 110. As shown in FIG. 4, the connector 160 can be coupled to the substrate in such a way that a pad 166 of a ground pattern 165 is connected with the ground circuit 115, and can be extended to the outside of a mold 140 and a shield 150.

In the step of forming a ground layer (S120), a conductive ground layer 130, which is connected with the ground circuit 115, is formed on the other surface of the substrate 110. The ground layer 130 is a part that forms a path for grounding the shield 150, and also functions to block electromagnetic waves generated from the semiconductor chip 120. For this, the ground layer 130 is made of a conductive material, such as a metal, and is formed on the other surface of the substrate 110 and connected with the ground circuit 115. Accordingly, grounding can be made by connecting the shield 150 to the other surface of the substrate 110 only. That is, the shield 150 can be readily grounded in an entirely molded semiconductor package as well.

In addition, the ground layer 130 forms a double shielding structure together with the shield 150 to improve the shielding property.

Figure 5:
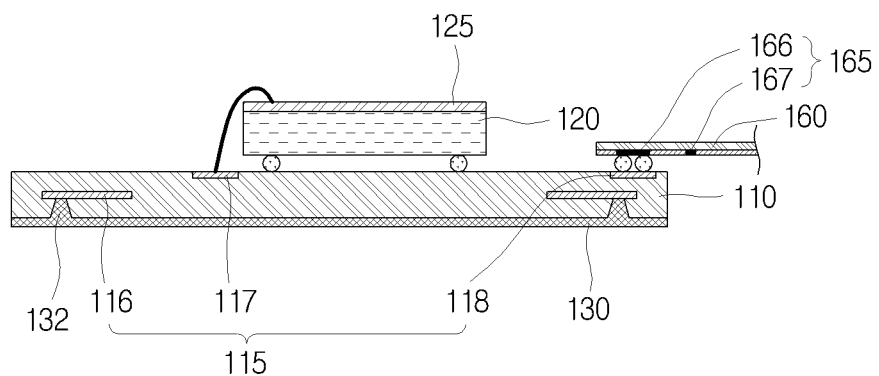
Figure 6:
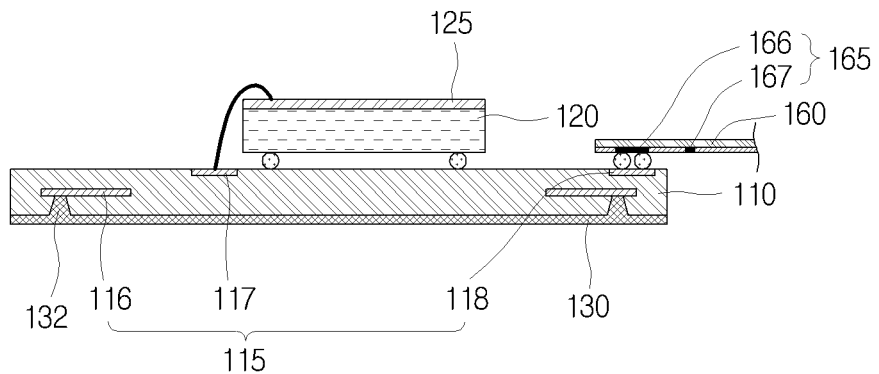

As shown in FIG. 5, the ground layer 130 of the present embodiment can be a form in which a conductive material is coated and hardened on the other surface of the substrate 110 or a conductive film is adhered to the other surface of the substrate 110. Moreover, the ground layer 130 can be connected to the ground circuit 115 of the substrate 110 through a via 132 formed on the other surface of the substrate 110.

Specifically, in the present embodiment, the conductive ground layer 130 that is connected to the ground circuit 115 is formed by forming a via hole, which exposes the ground circuit 115, on the other surface of the substrate 110 and then coating a conductive material on the other surface of the substrate 110.

In the step of forming a mold (S130), the mold 140 is formed in such a way that the substrate, in which the semiconductor chip 120 is mounted, and the ground layer 130 are sealed up.

Specifically, the molding 140 that covers and protects the substrate 110 and the semiconductor chip 120 can be formed by immersing the substrate 110, one surface of which is mounted with the semiconductor chip 120 and the other surface of which is formed with the ground layer 130, in a molding resin or by putting the substrate 110 in a molding frame and filling in a molding resin to seal up the substrate 110.

In the step of forming a shield (S140), the shield 150, which covers the molding 140 and is connected with the ground layer 130, formed. The shield 150 is a part that blocks electromagnetic waves from entering and exiting between an external part and the semiconductor package. For this, the shield 150 is made of a conductive material, such as metal, and covers the molding 140. Moreover, the shield 150 is connected with the ground layer 130 that is connected with the ground circuit 115.

Particularly, the shield 150 of the present embodiment is grounded through the ground layer 130 that is widely formed on the other surface of the substrate 110 so that it is easier to provide the space for grounding.

Figure 7:
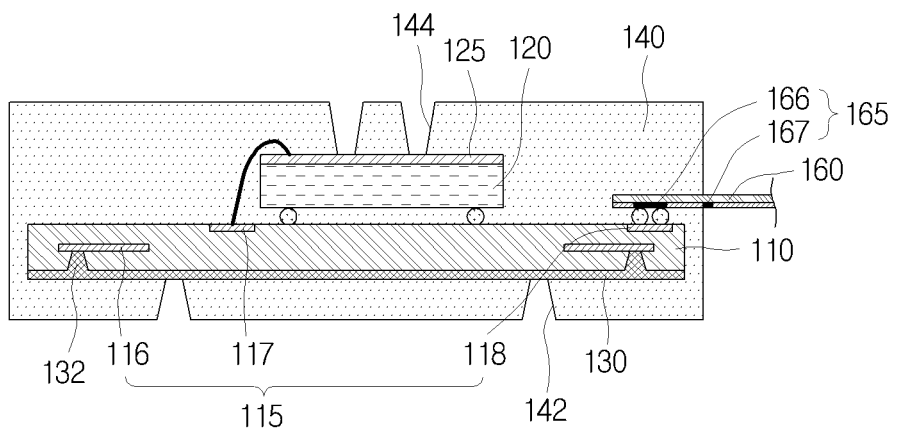
Figure 8:
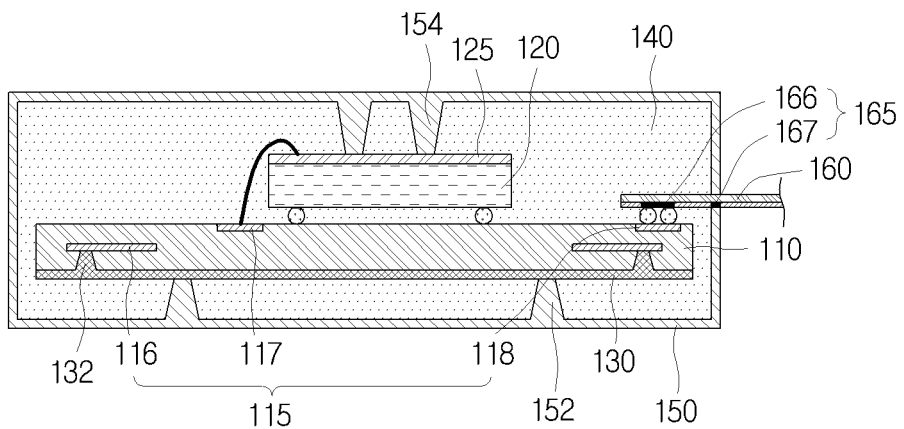

As shown in FIG. 7, in the present embodiment, a through-hole 142, through which the ground layer 130 is exposed, can be formed in the molding 140 in order to ground the shield 150. As shown in FIG. 8, by coating a conductive material on the molding 140 and forming a conductive post 152 in the through-hole 142, the shield 150 that is connected with the ground layer 130 can be formed.

Here, by forming together a through-hole 144, through which the semiconductor shielding layer 125 is exposed, in the molding 140, the semiconductor shielding layer 125 and the shield 150 can be connected with each other through a conductive post 154, which is formed in the through-hole 144 when the shield 150 is formed by coating the conductive material on the molding 140.

Moreover, it is also possible that, after a separate conductive post is formed on the ground layer 130 and molded, the shield 150 that is connected to the conductive post is formed.

For more uniform grounding of the shield 150, the ground pattern 165 of the connector 160 can be connected with the shield 150. As shown in FIG. 8, the shield 150 and the ground pattern 165 of the connector 160 can be connected with each other by coupling a pad 167 of the ground pattern 165 with the shield 150.

Hitherto, some embodiments of the present invention have been described. However, it shall be appreciated by anyone ordinarily skilled in the art to which the present invention pertains that there can be a variety of permutations and modifications of the present invention without departing from the technical ideas and scopes of the present invention that are disclosed in the claims appended below.

A large number of embodiments in addition to the above-described embodiments are present within the claims of the present invention.

What is claimed is:

1. A semiconductor package comprising:
    a substrate having a ground circuit formed thereon, a semiconductor chip being mounted on one surface of the substrate;
    a ground layer formed on another surface of the substrate opposite the one surface of the substrate, the ground layer being conductive and connected with the ground circuit;
    a molding sealing up the ground layer and the substrate having the semiconductor chip mounted thereon;
    a shield surrounding the molding, the shield being conductive and connected with the ground layer; and
    a connector, having a ground pattern connected with the shield and the ground circuit of the substrate and being connected to the outside of the shield, wherein:
    the ground layer and the substrate are sealed up by the molding,
    the shield covers an outer surface of the molding such that the shield is connected with the ground layer,
    the shield has an opening with the connector passing through the opening and the shield covers all the surfaces of the molding except for the opening, and
    the connector is extended to outside of the molding and the shield by passing through the molding and the opening of the shield.

2. The semiconductor package of claim 1, further comprising a semiconductor shielding layer, the semiconductor shielding layer being formed on an upper surface of the semiconductor chip and connected with the ground circuit.

3. The semiconductor package of claim 2, wherein the semiconductor shielding layer is connected with the shield.

4. The semiconductor package of claim 3, further comprising a conductive post, the conductive post connecting the shield and the semiconductor shielding layer with each other.

5. The semiconductor package of claim 2, wherein the semiconductor shielding layer and the ground circuit are connected by way of wire-bonding.

6. The semiconductor package of claim 1, further comprising an electronic device, the electronic device having a ground electrode connected with the ground circuit,
    wherein the ground electrode is connected with the shield.

* * * * *